United States Patent
Zhou et al.

(10) Patent No.: US 10,228,668 B2
(45) Date of Patent: Mar. 12, 2019

(54) MANAGEMENT OF AIRFLOW PROVISIONING TO MEET A COOLING INFLUENCE REDUNDANCY LEVEL

(75) Inventors: Rongliang Zhou, Sunnyvale, CA (US); Cullen E. Base, Los Gatos, CA (US); Tahir Cader, Liberty Lake, WA (US); Zhiki Wang, Fremont, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 770 days.

(21) Appl. No.: 14/408,673

(22) PCT Filed: Jul. 6, 2012

(86) PCT No.: PCT/US2012/045756
§ 371 (c)(1),
(2), (4) Date: Dec. 17, 2014

(87) PCT Pub. No.: WO2014/007828
PCT Pub. Date: Jan. 9, 2014

(65) Prior Publication Data
US 2015/0192316 A1    Jul. 9, 2015

(51) Int. Cl.
*F24F 11/00* (2018.01)
*G05B 15/02* (2006.01)
(Continued)

(52) U.S. Cl.
CPC ........... *G05B 15/02* (2013.01); *F24F 11/30* (2018.01); *F24F 11/62* (2018.01); *G06F 1/206* (2013.01); *H05K 7/20836* (2013.01)

(58) Field of Classification Search
None
See application file for complete search history.

(56) References Cited

U.S. PATENT DOCUMENTS

| 7,313,924 B2 | 1/2008 | Bash et al. |
| 7,534,167 B2 | 5/2009 | Day |

(Continued)

FOREIGN PATENT DOCUMENTS

| CN | 101356485 | 1/2009 |
| CN | 102197385 | 9/2011 |

(Continued)

OTHER PUBLICATIONS

PCT Search Report/Written Opinion~Application No. PCT/US2012/045756 dated Feb. 28, 2013~10 pages.
(Continued)

*Primary Examiner* — Jason Lin
(74) *Attorney, Agent, or Firm* — Hewlett Packard Enterprise Patent Department

(57) ABSTRACT

In an implementation, airflow provisioning in an area by a plurality of fluid moving devices is managed through assignment of the fluid moving devices to monitor and regulate conditions at respective subsets of a plurality of locations based upon determined influence levels of the fluid moving devices on the respective locations to meet a predefined cooling influence redundancy level. The predefined cooling influence redundancy level for a particular location identifies a number of the fluid moving devices that are to monitor and regulate a condition at the particular location.

13 Claims, 6 Drawing Sheets

(51) Int. Cl.
*G06F 1/20* (2006.01)
*H05K 7/20* (2006.01)
*F24F 11/30* (2018.01)
*F24F 11/62* (2018.01)

(56) References Cited

U.S. PATENT DOCUMENTS

| | | | |
|---|---|---|---|
| 7,596,431 B1* | 9/2009 | Forman | G06F 11/3034 |
| | | | 700/11 |
| 7,676,280 B1 | 3/2010 | Bash et al. | |
| 7,995,339 B2 | 8/2011 | Bash et al. | |
| 8,157,626 B2 | 4/2012 | Day | |
| 8,180,494 B2 | 5/2012 | Dawson et al. | |
| 8,290,629 B1 | 10/2012 | Mateski et al. | |
| 8,483,996 B2 | 7/2013 | Patel et al. | |
| 8,914,155 B1 | 12/2014 | Shah et al. | |
| 2004/0109288 A1* | 6/2004 | Beitelmal | F25D 17/06 |
| | | | 361/679.53 |
| 2005/0155646 A1 | 7/2005 | Bash et al. | |
| 2005/0187664 A1 | 8/2005 | Bash et al. | |
| 2006/0075764 A1* | 4/2006 | Bash | H05K 7/20745 |
| | | | 62/178 |
| 2006/0091229 A1 | 5/2006 | Bash | |
| 2006/0161307 A1 | 7/2006 | Patel et al. | |
| 2007/0038414 A1* | 2/2007 | Rasmussen | G06F 1/206 |
| | | | 703/1 |
| 2008/0176503 A1 | 7/2008 | Stanimirovic | |
| 2009/0112522 A1 | 4/2009 | Rasmussen | |
| 2009/0138313 A1* | 5/2009 | Morgan | G06Q 10/06 |
| | | | 705/7.23 |
| 2009/0302124 A1 | 12/2009 | Dawson et al. | |
| 2010/0057259 A1 | 3/2010 | Dawson et al. | |
| 2010/0256959 A1* | 10/2010 | Vangilder | G06F 1/20 |
| | | | 703/6 |
| 2010/0326098 A1 | 12/2010 | Rog et al. | |
| 2011/0040529 A1 | 2/2011 | Hamann et al. | |
| 2011/0106314 A1 | 5/2011 | Abdlmonem et al. | |
| 2011/0106751 A1 | 5/2011 | Sharma et al. | |
| 2011/0154842 A1 | 6/2011 | Heydari et al. | |
| 2012/0109404 A1* | 5/2012 | Pandey | G05D 23/00 |
| | | | 700/299 |
| 2012/0125028 A1* | 5/2012 | Keisling | H05K 7/20827 |
| | | | 62/228.1 |
| 2012/0158375 A1 | 6/2012 | Healey | |
| 2012/0170205 A1* | 7/2012 | Healey | H05K 7/20836 |
| | | | 361/679.46 |

FOREIGN PATENT DOCUMENTS

| | | |
|---|---|---|
| JP | 7332732 A | 12/1995 |
| JP | 11125452 | 5/1999 |
| JP | 20090257617 | 11/2009 |
| KR | 20060090429 | 8/2006 |

OTHER PUBLICATIONS

R Zhou et al—"Modeling and Control for Cooling Management of Data Centers with Hot Aisle Containment", Proc of ASME 2011 Int'l Mech Engineer Expo Jun. 2011~8 pages.

Rongliang Zhou et al., "Failure Resistant Data Center Cooling Control Through Model-Based Thermal Zone Mapping", HP Labs, Apr. 6, 2012~8 pages.

Webpage~"AiNET"~http://www.ai.net/data-centers/cooling~2012~5 pages.

AdaptivCool, "Managing Cooling Capacity & Redundancy in Data Centers Today", 49 pages, download date, Dec. 16, 2014. http://www.adaptivcool.com/downloads/Presentations/Capacity%20and%20Redundancy%20Management%20Webinar.pdf.

EEE, "Data Center Cooling with Demand Based Cooling", 1 page, download date: Dec. 16, 2014. http://www.eecnet.com/Services/Data-Center-Energy-Efficiency---Cooling/Demand-Based-Cooling.

Chen, Y., et al; "Integrated Management of Application Performance, Power and Cooling in Data Centers"; 2010 8 pages.

Goren, B., "Creating Data Center Efficiencies Using Closed-loop Design"; May 20, 2009; 6 pages.

Greenberg, S. et al; "Best Practices for Data Centers: Lessons Learned from Benchmarking 22 Data Centers"; Aug. 17, 2006, ACEEE Summer Study, 21 Pages.

Lee, E.K. et al "Proactive Thermal Management in Green Datacenters"; Jun. 10, 2010; 31 pages.

Patnaik, D. et al,; "Sustainable Operation and Management of Data Center Chillers Using Temporal Data Mining"; Jun. 28, 2009-Jul. 1, 2009.; 9 pages.

PCT; "International Searching Authority, The International Search Report and the Written Opinion" Aug. 24, 2012, 9 Pages.

PCT; "International Searching Authority, The International Search Report and the Written Opinion"; Feb. 5, 2016, 10 Pages.

Schmidt, R. R., et al,; "Challenges of Data Center Thermal Management"; (2005), pp. 709-723.

Seeber, W. et al.; "Improving Data Center Energy Efficiency Through Environmental Optimization"; Oct. 31, 2012; 11 pages.

Sharma, R., et al., "Balance of Power: Dynamic Thermal Management for Internet Data Centers"; Feb. 18, 2003, 14 Pages.

U.S. Environmental Protection Agency (EPA); "Report to congress on server and data center energy efficiency. public law 109-43"; Aug. 2, 2007; 133 Pages.

Zhou, R.; et al.; "A Holistic and Optimal Apprach for Data Center Cooling Management", Jun. 29-Jul. 1, 2011; 6 Pages.

* cited by examiner

US 10,228,668 B2

MANAGEMENT OF AIRFLOW PROVISIONING TO MEET A COOLING INFLUENCE REDUNDANCY LEVEL

BACKGROUND

Data centers typically include multiple cooling units, such as, computer room air conditioning (CRAC) units, arranged to supply cooling airflow to a plurality of servers arranged in rows of racks. The cooling airflow is often supplied through vent tiles distributed at multiple locations on a raised floor. More particularly, the cooling units supply cooling airflow into a plenum formed beneath the raised floor and the cooling airflow is supplied to the servers through the vent tiles.

Guaranteed uptime is typically an objective of mission critical data centers. As a result, most data center designs have built-in redundancy in their cooling systems. In typical N+k cooling redundancy designs, the cooling systems often over provision cooling to accommodate possible cooling system component failures. The over-provisioning of the cooling is performed by constantly running all of the cooling units at a capacity targeting the worst case failure scenario. As such, although the desired level of redundancy may be achieved, the cooling efficiency is greatly decreased. Conventional redundancy practices therefore lead to high operational costs and ultimately a high total cost of ownership.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
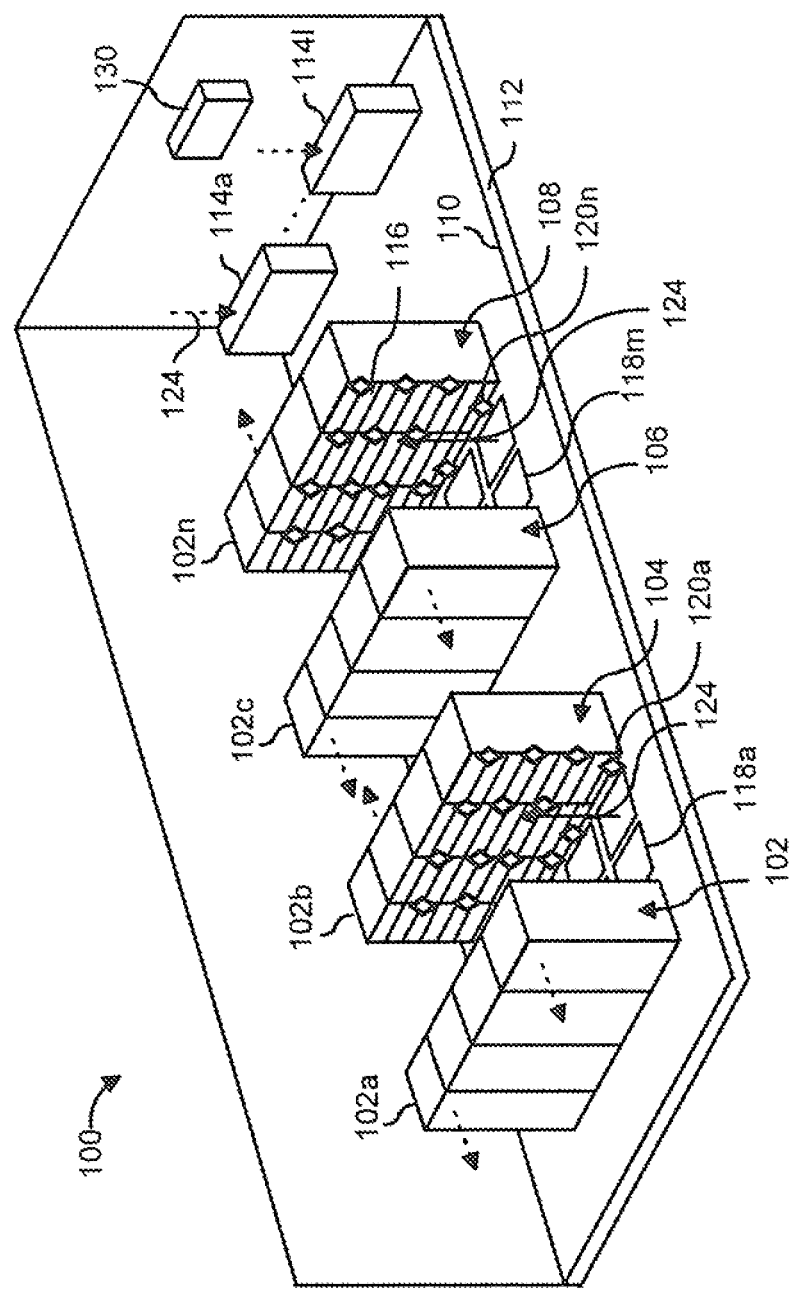
FIG. 1 illustrates a simplified block diagram of a section of an area, in this instance a data center, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on. In addition, the variables "l", "m" and "n" are intended to denote integers equal to or greater than one and may denote different values with respect to each other.

Conventional techniques for categorizing cooling redundancy merely add additional cooling units into a data center without regard as to how the positioning of the additional cooling units affect different locations within the data center. As a result, the redundancy afforded by the additional cooling units is different for different locations within the data center. In addition, conventional techniques for categorizing cooling redundancy fail to consider the capacities of the cooling units and thus, there is no consideration as to how the cooling units are to be run. As such, conventional techniques of providing cooling redundancy merely run all of the cooling units all of the time or cycle all of the cooling units according to a predefined schedule. Conventional techniques for categorizing cooling redundancy therefore fail to accurately describe how the additional cooling units actually provide cooling redundancy in data centers and how the cooling redundancy may be achieved in a cost-efficient manner.

Disclosed herein is a cooling influence redundancy level, which may be defined as the number of cooling units, also referred herein as fluid moving devices, that are actively monitoring and regulating a condition, such as temperature, at a particular location. In other words, a location of interest, such as a rack inlet, is considered to have a "N+k" cooling influence redundancy level if the condition, such as temperature, at this location of interest is monitored and actively maintained by "k+1" cooling units. Thus, by way of example, if a thermal violation (e.g., temperature outside of a predetermined range) occurs at a location with a "N+k" cooling influence redundancy level, "k+1" cooling units will detect this thermal violation and respond simultaneously to mitigate the adverse thermal conditions. As such, a cooling influence redundancy level of "N+k" has a built-in action policy to respond to thermal violations at any location of interest when one or more cooling unit failures occur.

In one regard, by defining cooling influence redundancy levels for locations of interest in an area, such as rack inlets of a data center, the number of fluid moving devices that are able to provide redundant regulation of conditions at those locations may also be defined. As such, if one or more fluid moving devices that are to regulate a condition at a particular location of interest fails, other fluid moving devices that are also assigned to regulate the condition at that particular location of interest may vary their operations to compensate for the failure. In this regard, the cooling influence redundancy disclosed herein enables dynamic cooling redundancy to be performed in the area regardless of the locations in which the fluid moving devices are positioned in the area so long as there are at least two fluid moving devices that are able to supply cooling airflow to the different locations in the area.

Disclosed herein is a method for managing airflow provisioning in an area, such as a data center, by a plurality of fluid moving devices, in which the fluid moving devices are assigned to subsets of locations of interest in the area to meet predefined cooling influence redundancy levels for the locations of interest. Also disclosed herein are an apparatus for implementing the method and a non-transitory computer readable medium on which is stored machine readable instructions that implement the method.

As disclosed herein, the respective levels of influence each of the fluid moving devices has on the locations of interest are determined through use of a model that describes airflow transport and distribution to the locations of interest. In addition, the determined levels of influence are used to assign the fluid moving devices to the respective subsets of the locations of interest to meet the predefined cooling influence redundancy levels. As also disclosed herein, the fluid moving devices are managed to substantially minimize energy consumption in maintaining conditions at the locations of interest within predetermined ranges. More particularly, the fluid moving devices may be managed according to determined settings that minimize a cost function. In addition, according to an example, the fluid moving devices are managed by a set of controllers that are distributed with respect to each other.

Through implementation of aspects of the present disclosure, a cooling control technique is provided that results in cooling redundancy with relatively high cooling efficiency, e.g., through substantially minimizing the costs associated with airflow provisioning. In addition, the cooling control technique disclosed herein enables fluid moving devices to automatically respond to cooling failures in an area, to thereby avoid or mitigate damage caused by the failures. Moreover, aspects of the present disclosure also enable the controllers of the fluid moving devices to be distributed with respect to each other such that failure of a controller does not result in failures of all of the fluid moving devices.

With reference first to FIG. 1, there is shown a simplified perspective view of a section of an area 100, in this instance, a data center, in which a method and apparatus for managing airflow provisioning may be implemented, according to an example. The data center 100 is depicted as having a plurality of racks 102a-102n, a plurality of fluid moving devices (FMDs) 114a . . . 114l (the ellipses denoted between the FMDs 114a and 114l signify that the data center 100 may include additional fluid moving devices), a plurality of vent tiles 118a-118m, and a plurality of sensors 120a-120n.

The racks 102a-102n are depicted as being positioned on a raised floor 110 and as housing electronic devices 116. The electronic devices 116 comprise, for instance, computers, sewers, bladed servers, disk drives, displays, etc. As shown in FIG. 1, airflow, such as cool airflow, is delivered through vent tiles 118a-118m in the floor 110 to the racks 102a-102n. The FMDs 114a-114l generally operate to supply airflow into a space 112 beneath the raised floor 110, and in certain instances to cool heated airflow (indicated by the arrows 124). The FMDs 114a-114l may comprise, for instance, air conditioning (AC) units that have actuators for controlling the temperature and the volume flow rate of the cooled airflow supplied by the fluid moving devices 114a-114l. In other examples, the FMDs 114a-114l comprise heaters having actuators to control the temperature and volume flow rate of heated airflow supplied by the fluid moving devices 114a-114l.

The vent tiles 118a-118m comprise manually and/or automatically adjustable vent tiles. In any regard, the vent tiles 118a-118m may be adjusted to thereby vary the volume flow rate of airflow supplied through the vent tiles 118a-118m. When the vent tiles 118a-118m comprise automatically adjustable vent tiles, actuators (not shown) are provided to vary the operational settings of the vent tiles 118a-118m. In addition, each of the vent tiles 118a-118m may also include an interface through which the vent tiles 118a-118m may receive instruction signals from a controller 130. The operational settings of the vent tiles 118a-118m may include the opening levels of the vent tiles 118 that may be used to vary the volume flow rate of the airflow and, in some instances, a speed level of local fans used to vary the flow rates of the airflow through the vent tiles 118a-118m. The vent tiles 118a-118m may have many different suitable configurations and are thus not to be limited to any particular type of vent tile.

In any regard, the airflow contained in the space 112 may include airflow supplied by more than one of the FMDs 114a-114l. Thus, characteristics of the airflow, such as, temperature, pressure, humidity, flow rate, etc., delivered to various locations in the data center 100 may substantially be affected by the operations of multiples ones of the FMDs 114a-114l. As such, conditions at various locations in the data center 100 may substantially be affected by the operations of more than one of the FMDs 114a-114l. For instance, the temperature at an inlet of a particular rack may be affected by more than one of the FMDs 114a-114l and thus, if one of the FMDs 114a were to fail, another one of the FMDs 114b may be able to deliver cooling airflow to that particular rack.

The sensors 120a-120n may be positioned in the data center 100 at various desired locations, such as at the inlets of various racks of interest, within the equipment 116 (which may comprise sensors integrated within the equipment 116), the inlets and/or outlets of FMDs 114a-114l, etc. The locations of interest at which the sensors 120a-120n are located may comprise a subset of all of the racks contained in the data center 100, a subset of all of the FMDs 114a-114l, etc. In addition, multiple sensors 120a-120n may be positioned at various locations of interest. In any regard, the sensors 120a-120n may be networked, in a wired and/or wireless manner, with the controller 130 to convey detected condition information to the controller 130. The detected conditions may include, for instance, temperatures at the inlets of the racks 102a-102n, temperatures at the outlets of the vent tiles 118, temperatures at the inlets and/or outlets of FMDs 114a-114l, temperatures within some or all of the equipment 116, etc. The detected conditions may, in addition or alternatively, include other environmental conditions, such as, pressure, humidity, airflow velocity, etc. In this regard, the sensors 120a-120n comprise any suitable types of sensors to detect the conditions.

As discussed in greater detail herein below, environmental condition information collected by the sensors 120a-120n is used to determine various parameters of a model that describes airflow transport and distribution within the data center 100. In one example, the model comprises a physics based state-space model. As also discussed in greater detail herein below, the model further describes effects of actuations on the fluid moving devices 114a-114l, and in certain instances, the settings of the vent tiles 118a-118m, on the airflow transport and distribution within the data center 100. In this regard, the model disclosed herein may be a holistic model. Moreover, the model is implemented to manage airflow provisioning in the data center 100, which includes minimization of the power required to cool the equipment 116 in the data center 100. In addition, the management of airflow provisioning also includes compensation for failures by one or more of the fluid moving devices 114a-114l or their respective controllers.

In one example, values obtained through implementation of the model are used to determine the levels of influence each of the fluid moving devices 114a-114l has at various locations of the data center 100, such as at the inlets of the racks. The respective levels of influence that the fluid moving devices 114a-114l have on the various locations of the data center 100 are used to meet predefined cooling influence redundancy levels for the various locations. The cooling influence redundancy level generally identifies a number of the fluid moving devices 114a-114l that are to monitor and regulate a condition at a particular location, e.g., a particular rack inlet. The cooling influence redundancy level may therefore be considered as a level of redundancy to be provided to the particular location. In this regard, a predetermined number of fluid moving devices 114a-114l having the highest level of influence over a particular location's condition may be assigned to monitor and regulate the condition at the particular location to thereby meet the predefined cooling influence redundancy level for that particular location. In addition, the predefined cooling influence redundancy level may vary between locations or may be uniform throughout the data center 100.

In another example, the obtained values are used to control the fluid moving devices 114a-114l and the vent tiles 118a-118m (when the vent tiles 118a-118m comprise adjustable vent tiles) to manage airflow provisioning in the data center 100. In a further example, the obtained values are used in the minimization of a cost function to determine how the fluid moving devices 114a-114l are to be operated to meet a predefined operational goal, such as minimization of energy consumption by the fluid moving devices 114a-114l in maintaining conditions in the data center 100 within predetermined levels.

It should be understood that the data center 100 may include additional elements and that some of the elements described herein may be removed and/or modified without departing from a scope of the data center 100. In addition, the data center 100 may comprise a data center that is in a fixed location, such as a building, and/or a data center that is in a movable structure, such as a shipping container or other relatively large movable structure. Moreover, although particular reference has been made in the description of the area 100 as comprising a data center, it should be understood that the area 100 may comprise other types of structures, such as, a room in a building, an entire building, etc.

Although the controller 130 is illustrated in FIG. 1 as comprising an element separate from the electronic devices 116, the controller 130 may comprise or be integrated with an electronic device 116 without departing from a scope of the data center 100 disclosed herein. In addition, or alternatively, the controller 130 may comprise a set of machine readable instructions to operate on a computing device, for instance, one of the electronic devices 116 or a different computing device. Moreover, although a single controller 130 has been depicted in FIG. 1, a plurality of controllers 130 may be implemented to respectively control individual ones or groups of fluid moving devices 114a-114l and, in further examples, individual ones or groups of vent tiles 118a-118m.

Figure 2:
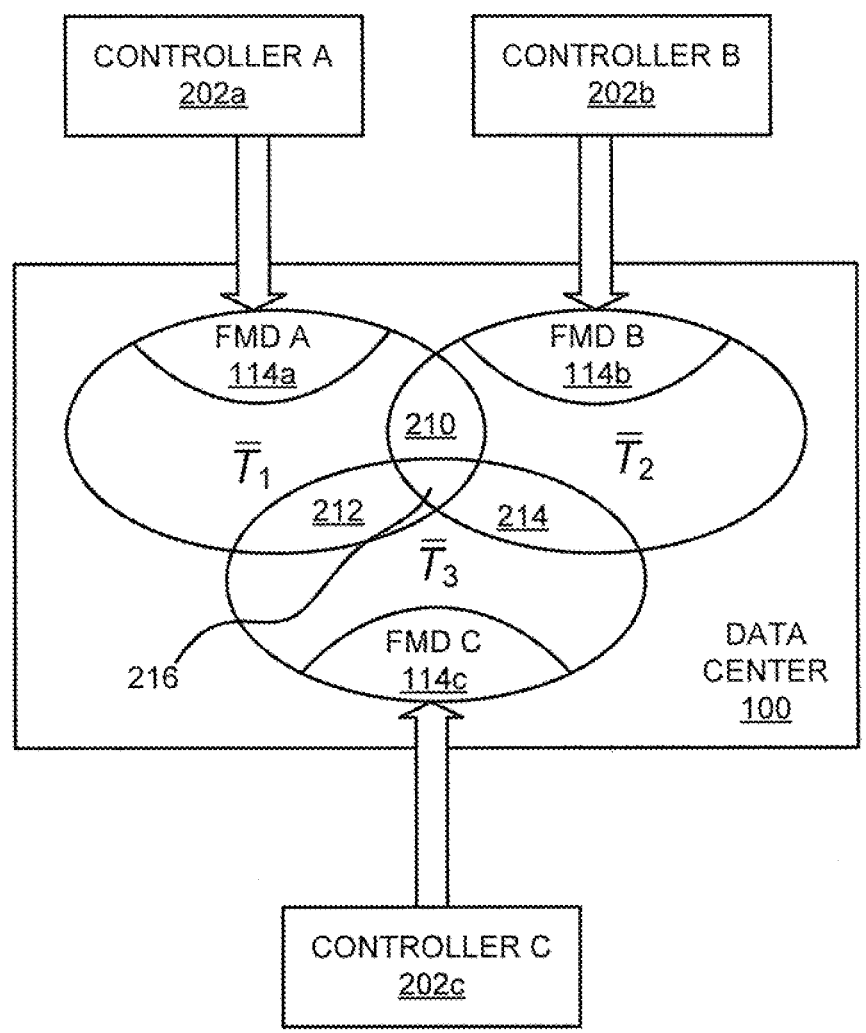
FIG. 2 shows a diagram of a decentralized control system structure, according to an example of the present disclosure.

Turning now to FIG. 2, there is shown a diagram 200 of a decentralized control system structure, according to an example. In the diagram 200, only three fluid moving devices (FMDs) 114a-114c and three controllers 202a-202c are shown for purposes of simplicity, but it should be understood that any suitable number of FMDs 114a-114l and controllers 202a-202l may be provided without departing from a scope of the decentralized control system structure depicted therein.

In FIG. 2, the ovals around each of the FMDs 114a-114c represent locations in the data center 100 assigned to the FMDs 114a-114c, which are also referred herein as zones of influence of the FMDs 114a-114l. As depicted in FIG. 2, a first FMD 114a and a second FMD 114b share an overlapping area 210, the first FMD 114a and a third FMD 114c share an overlapping area 212, the second FMD 114b and the third FMD 114c share an overlapping area 214, and all three FMDs 114a-114c share an overlapping area 216. In addition, the first FMD 114a is controlled by a first controller 202a, the second FMD 114b is controlled by a second controller 202b, and the third FMD 114c is controlled by a third controller 202c. Each of the controllers 202a-202c may comprise or may be integrated with an electronic device 116. In addition, or alternatively, each of the controllers 202a-202c may comprise a set of machine readable instructions to operate on a computing device, for instance, one of the electronic devices 116 or a different computing device.

According to an example, each of the controllers 202a-202c comprises a set of machine readable instructions that is stored in a separate machine with respect to the other sets of machine readable instructions, such that failure of a particular controller will not cause all of the fluid moving devices 114a-114c to fail. The separate machines may comprise multiple ones of the electronic devices 116, respective FMDs 114a-114c, combinations thereof, etc.

In any regard, each of the controllers 202a-202c is to control characteristics of airflow supplied by a respective FMD 114a-114c. The characteristics of the airflow include the temperature and/or the volume flow rate of the airflow supplied by FMDs 114a-114c. Although not shown, each of the controllers 202a-202c is to access data pertaining to conditions detected by sensors 120a-120n contained in the respective zones of influence of the FMDs 114a-114c.

Generally speaking, the diagram 200 in FIG. 2 depicts a failure resistant decentralized cooling control system structure. That is, each of the overlapping areas 210-216 denote that if the first FMD 114a fails, the temperature vector ($T_1$) will increase and the temperature increase in the overall regions 210 and 212 will be sensed by the second controller 202b and the third controller 202c. The second controller 202b and the third controller 202c may each respond by provisioning greater cooling resources from the second FMD 114b and the third FMD 114c, which will increase the supply of cooling airflow to the thermal zone originally regulated by the first FMD 114a to thereby mitigate temperature increases due to the failure of the first FMD 114a.

According to an example, each of the controllers 202a-202c may monitor and regulate conditions at various locations in the data center 100 to meet a predefined cooling influence redundancy level in the data center 100. That is, for instance, if each of the locations of interest in the zone of interest of the first FMD 114a is to have a predefined cooling influence redundancy level of n+1, then the conditions detected by the sensors 120a-120n in that zone of influence are available to at least one of the second and third controllers 202b and 202c, such that at least one of the second and third controllers 202b and 202c are also able to monitor and regulate conditions in the zone of influence of the first FMD 114a. As such, the cooling influence redundancy level may be defined as an identification of a number of fluid moving devices 114a-114l (or their controllers 202a-202c) that are to monitor and regulate a condition at a particular location of interest, such as a rack inlet.

As also discussed in greater detail herein below, the controllers 202a-202c are to control operations of the FMDs 114a-114l, such that the amount of energy consumed by the FMDs 114a-114l in meeting cooling objectives is substantially minimized. That is, in contrast to conventional redundant systems, the FMDs 114a-114l may not be operated at relatively high energy consumptions to provide redundancy.

Figure 3:
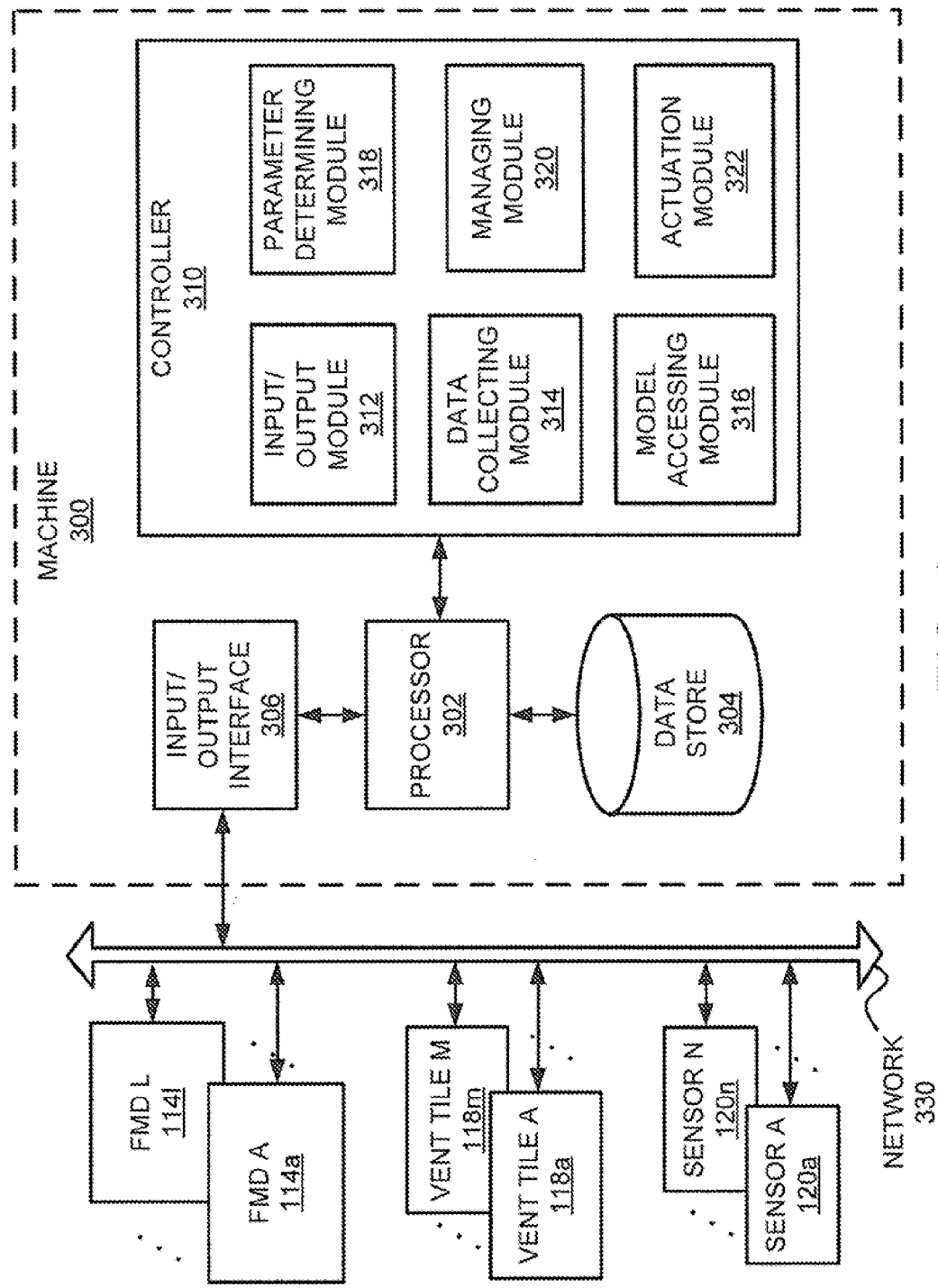
FIG. 3 shows a block diagram of a machine for managing airflow provisioning in the area depicted in FIG. 1, according to an example of the present disclosure.

Turning now to FIG. 3, there is shown a block diagram of a machine 300 for managing airflow provisioning in an area 100, such as the data center depicted in FIG. 1, according to an example. It should be understood that the machine 300 may include additional components and that some of the components described herein may be removed and/or modified without departing from the scope of the machine 300.

As shown, the machine 300 includes a processor 302, a data store 304, an input/output interface 306, and a controller 310. The machine 300 comprises any of, for instance, a server, a computer, a laptop computer, a tablet computer, a personal digital assistant, a cellular telephone, or other electronic apparatus that is to perform a method for managing airflow provisioning in an area by a plurality of fluid moving devices 114a-114l.

The controller 310 is further depicted as including an input/output module 312, a data collecting module 314, a model accessing module 316, a parameter determining module 318, a managing module 320, and an actuation module 322. The controller 310 may comprise the controller 130 depicted in FIG. 1, any of the controllers 202a-202c depicted in FIG. 2, or other controller of the FMDs 114a-114l. In any regard, the processor 302, which may comprise a microprocessor, a micro-controller, an application specific integrated circuit (ASIC), or the like, is to perform various processing functions in the machine 300. One of the processing functions includes invoking or implementing the modules 312-322 contained in the controller 310 as discussed in greater detail herein below.

According to an example, the controller 310 comprises machine readable instructions stored, for instance, in a volatile or non-volatile memory, such as DRAM, EEPROM, MRAM, flash memory, floppy disk, a CD-ROM, a DVD-ROM, or other optical or magnetic media, and the like. In this example, the modules 312-322 comprise modules of machine readable instructions stored in the memory, which are executable by the processor 302. According to another example, the controller 310 comprises a hardware device, such as a circuit or multiple circuits arranged on a board. In this example, the modules 312-322 comprise circuit components or individual circuits, which the processor 302 is to control. According to a further example, the controller 310 comprises a combination of modules with machine readable instructions and hardware modules.

The input/output interface 306 comprises a hardware and/or a software interface that may be connected to an internal bus and/or to a network 330, over which the controller 310 may receive and communicate information. The network 330 generally represents a wired and/or wireless structure in the data center 100 for the transmission of data and/or signals between the various components in the data center 100. As also shown in FIG. 3, and according to an example, the fluid moving devices 114a-114l, the vent tiles 118a-118m, and the sensors 120a-120n are also connected to the network 330 and may thus communicate data with and/or receive instructions from the processor 302. In examples in which the vent tiles 118a-118m do not comprise adaptive vent tiles, the vent tiles 118a-118m may be removed from FIG. 3. In addition, in examples in which the controller 310 is to control a particular FMD 114a, the remaining FMDs 114b-114l may be removed from FIG. 3. Likewise, FIG. 3 may depict the subset of sensors 120a-120n from which the controller 310 is to receive data and the remaining sensors 120a-120n may be removed from FIG. 3.

According to an example, the sensors 120a-120n are each assigned an identifier that is unique to the sensor within the set of sensors 120a-120n and the locations of the sensors 120a-120n are tracked along with their respective identifiers. In this regard, when the sensors 120a-120n communicate sensed data, such as a measured temperature at a particular rack inlet, the sensors 120a-120n may include their identifiers in the communications to enable their locations to be determined. In any regard, each of the controllers 310 of the FMDs 114a-114l may use sensed data from only those sensors 120a-120n to which the controllers 310 are assigned to monitor and regulate, for instance, as determined by the predefined cooling influence redundancy levels of the FMDs 114a-114l with respect to the locations in which the sensors 120a-120n are located.

According to an example, the sensors 120a-120n broadcast their sensed data to each of the controllers 310 of the FMDs 114a-114l. In another example, the sensors 120a-120n communicate their sensed data to a database and the controllers 310 of the FMDs 114a-114l access the database to retrieve sensed data stored in the database from the sensors 120a-120n to which they are respectively assigned. In a further example, the controllers 310 of the FMDs 114a-114l ping the sensors 120a-120n to which they are respectively assigned for current condition data at regular intervals of time.

In any regard, the processor 302 may receive the sensed data from the sensors 120a-120n or selected subsets of the sensors 120a-120n through the input/output interface 306 and may store the received data in the data store 304. The processor 302 may use the sensed data, as well as other data stored in the data store 304 in implementing the modules 312-322. The data store 304 comprises volatile and/or non-volatile memory, such as DRAM, EEPROM, MRAM, phase change RAM (PCRAM), Memristor, flash memory, and the like.

According to an example, the controller 310 outputs operational settings of the FMDs 114a-114l to be implemented, for instance, during determination of the respective influence levels of the FMDs 114a-114l on each of a plurality of locations. The operational settings may include volume flow rate set point(s), instructions pertaining to the determined volume flow rate set point(s), determined supply temperature set point(s), instructions pertaining to the determined supply temperature set point(s), determined operational settings and/or instructions pertaining to the determined operational settings through the input/output module 306, etc.

According to an example, the operational settings are outputted to a display upon which the outputted information may be displayed, a printer upon which the outputted information may be printed, a network connection over which the outputted information may be conveyed to another computing device, a data storage device upon which the outputted information may be stored, etc. In this instance, a user may manually cause the FMDs 114a-114l to be set to the operational settings, According to another example, the controller 310 communicates instruction signals over the network 330 to the FMDs 114a-114l. In this example, the FMDs 114a-114l, or their respective controllers, may vary the volume flow rates and/or supply air temperatures of the FMDs 114a-114l to reach the determined set points as instructed by the controller 310. According to another example, the operational settings of the vent tiles 118a-118m are also varied during determination of the respective influence levels of the FMDs 114a-114l on each of a plurality of locations.

As also discussed in greater detail herein below, the controller 310 may additionally or alternatively comprise a controller of a FMD 114a. In addition, each of the remaining FMDs 114b-114l may be controlled by a respective controller having the configuration of the controller 310. In this example, each of the controllers 310 of the FMDs 114a-114l may be stored or contained in separate machines 300 to thereby enhance redundancy in the control of the FMDs 114a-114l. In addition, each of the controllers 310 of the FMDs 114a-114l may be assigned to monitor and regulate conditions of particular locations based upon conditions detected by the sensors 120a-120n. Moreover, each of the controllers 310 is to control respective ones of the FMDs 114a-114l in manners that substantially minimize the amount of energy consumed by the FMDs 114a-114l in maintaining conditions in the locations within predetermined ranges. As used throughout the remainder of the present disclosure, references to various operations performed by the FMDs 114a-114l are to be considered as equivalently being performed by the controllers 310 of the FMDs 114a-114l.

Figure 4:
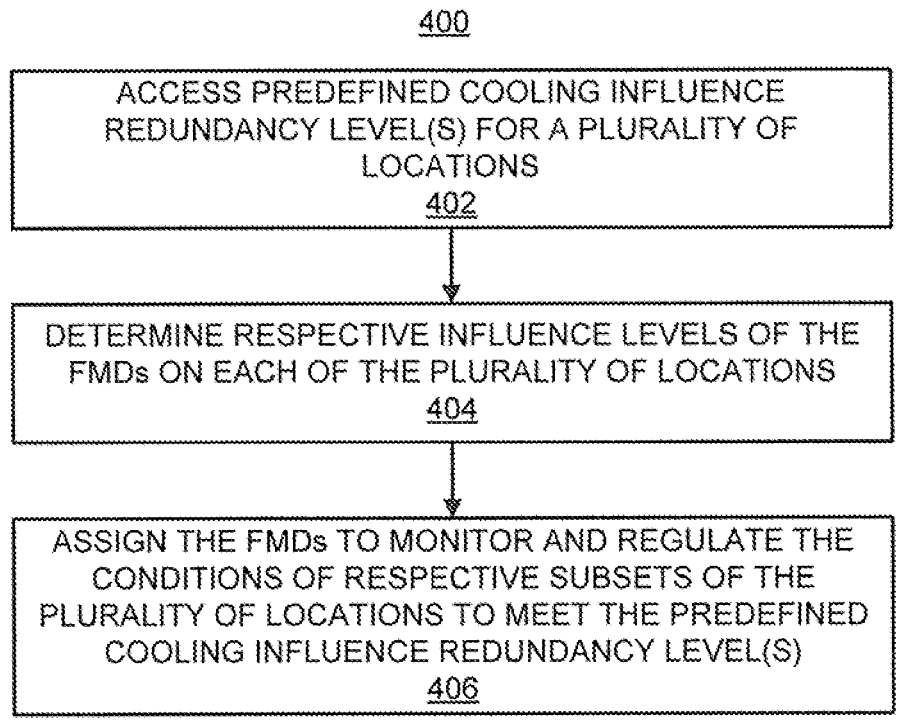
FIG. 4 illustrates a flow diagram of a method for managing airflow provisioning in an area, such as the data center depicted in FIG. 1, according to an example of the present disclosure.
Figure 5:
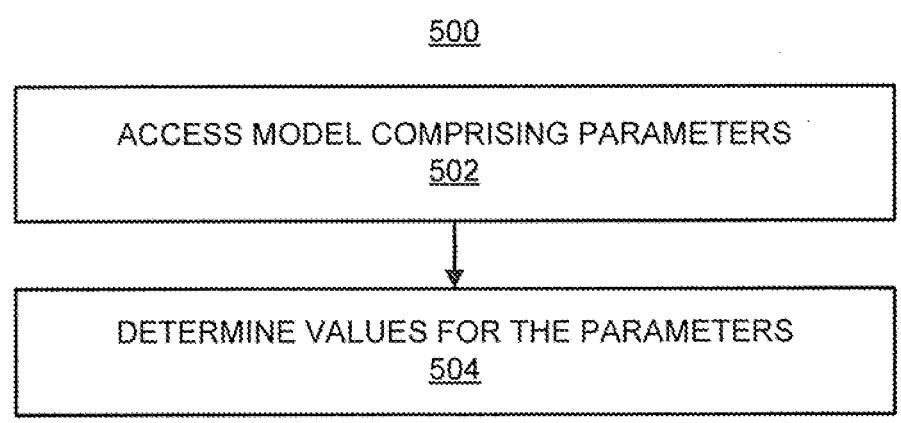
FIG. 5 depicts a flow diagram of a method of determining respective influence levels of fluid moving devices on each of a plurality of locations, according to an example of the present disclosure.
Figure 6:
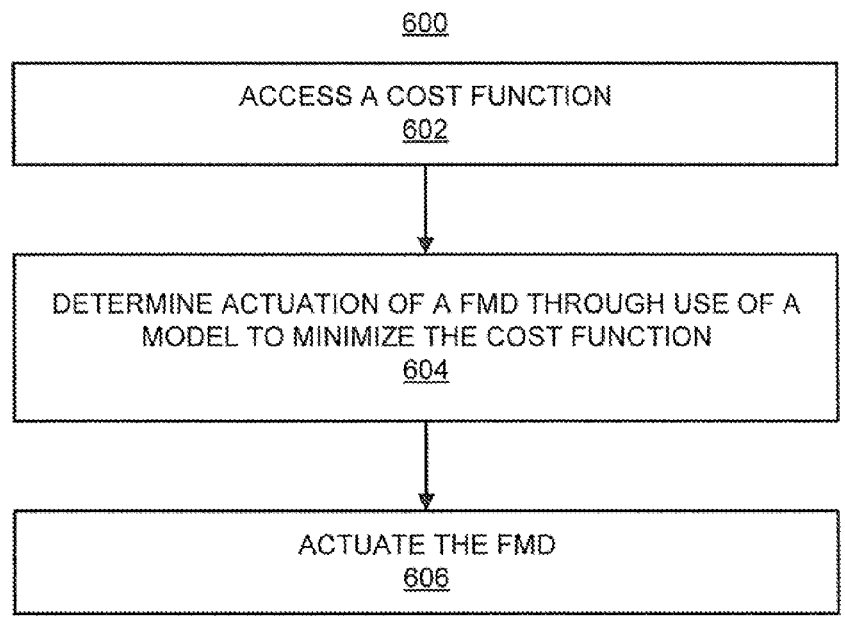
FIG. 6 depicts a flow diagram of a method for managing airflow provisioning, and more particularly, for controlling, by a controller of a fluid moving device, the fluid moving device to regulate the conditions at a plurality of locations that are assigned to the controller, according to an example of the present disclosure.

Various manners in which the modules 312-322 of the controller 310 may operate are discussed with respect to the methods 400-600 depicted in FIGS. 4-6. It should be readily apparent that the methods 400-600 respectively depicted in FIGS. 4-5 represent generalized illustrations and that other elements may be added or existing elements may be removed, modified or rearranged without departing from the scopes of the methods 400-600.

With reference first to FIG. 4, there is shown a flow diagram of a method 400 for managing airflow provisioning in an area, such as, a data center 100, according to an example. At block 402, a predefined cooling influence redundancy level for a plurality of locations in the area, e.g., data center 100, is accessed, for instance, by the managing module 320. As discussed above, the cooling influence redundancy level for a particular location identifies a number of the FMDs 114a-114n that are to monitor and regulate a condition at the particular location.

According to an example, the cooling influence redundancy level for the plurality of locations is predefined by a user, such as a data center administrator, a customer who is to receive the data center resources, etc., and may be stored in the data store 304. In addition, a number of different cooling influence redundancy levels may be predefined for a number of different locations of interest in the data center 100. Thus, for instance, locations, e.g., racks, housing equipment 116 that are to perform relatively more critical operations may have a relatively higher cooling influence redundancy level than other locations that house equipment 116 that are to perform relatively less critical operations. In this regard, a data center 100 operator may charge customers different rates depending upon the cooling influence redundancy levels the customers seek.

At block 404, respective influence levels of the plurality of FMDs 114a-114n on each of the plurality of locations are determined, for instance, by the model accessing module 316 and the parameter determining module 318. Various manners in which the respective influence levels of the plurality of FMDs 114a-114n on each of the plurality of locations may be determined are described in greater detail below with respect to the method 400 in FIG. 4.

At block 406, the FMDs 114a-114l are assigned to monitor and regulate the conditions of respective subsets of the plurality of locations to meet the predefined cooling influence redundancy level(s), for instance, by the managing module 320. More particularly, the controllers 310 of the FMDs 114a-114l are assigned to monitor and regulate those locations over which the FMDs 114a-114l have a determined influence level, in which the number of controllers 310 assigned to monitor and regulate those locations is determined by the predefined cooling influence redundancy level. Thus, by way of example, for a particular location whose condition is detected by a sensor 120a, a first FMD 114a may be determined to have the highest influence level on that particular location, a second FMD 114b may be determined to have the second highest influence level on that particular location, and a third FMD 114c may be determined to have the third highest influence level on that particular location. In this example, if the predefined cooling influence redundancy level is N+1, then the controllers 310 of the first FMD 114a and the second FMD 114b are assigned to monitor and regulate the particular location. Alternatively, if the predefined cooling influence redundancy level is N+2, then the controllers 310 of each of the first, second, and third FMDs 114a-114c are assigned to monitor and regulate the particular location.

Assignment of the plurality of FMDs 114a-114l to monitor and regulate the conditions of respective subsets of the plurality of locations generally means that the FMDs 114a-114l are to track the conditions detected by respective ones of the sensors 120a-120n in the subsets of the plurality of locations, such as sensors 120a-120n located at the inlets of the racks as depicted in FIG. 1. As such, in the example above, in which the predefined cooling redundancy level is N+1 for the particular location, the controllers 310 of the first and second FMDs 114a and 114b are to track and regulate conditions detected by the sensor 120a. In addition, the controller 310 of the third FMD 114c does not track the conditions detected by the sensor 120a. As such, if the first FMD 114a were to fail, the second FMD 114b would still be able to monitor and regulate the conditions at the location of the sensor 120a.

According to a particular example, at block 402, a first predefined cooling influence redundancy level for a first location and a second predefined cooling influence redundancy level for a second location are accessed, in which the second predefined cooling influence redundancy level differs from the first predefined cooling influence redundancy level. In this example, assigning of the plurality of FMDs 114a-114n at block 406 further comprises assigning the plurality of FMDs 114a-114l to monitor and regulate the conditions of the first location and the second location based upon the determined influence levels of the plurality of FMDs 114a-114l on the first location and the second location to meet the first predefined cooling influence redundancy level on the first location and the second predefined cooling influence redundancy level on the second location.

Turning now to FIG. 5, there is shown a flow diagram of a method 500 of determining the respective influence levels of the FMDs 114a-114l on each of the plurality of locations, according to an example. In this regard, the method 500 depicts a relatively more detailed operation of block 404 in FIG. 4.

At block 502, a model that describes airflow transport and distribution within the area is accessed, for instance, by the model accessing module 316. The model may be stored in the data store 304 and the model accessing module 316 may access the model from the data store 304. The model comprises a plurality of parameters and describes the effects of actuations on the plurality of FMDs 114a-114l on the airflow transport and distribution within the area, such as the data center 100. More particularly, the model describes the effects of actuations on the plurality of FMDs 114a-114l and the vent tiles 118a-118m in instances in which the vent tiles 118a-114m are adjustable or are otherwise to be considered, on the transport and distribution of airflow supplied into the racks and thus the electronic devices 116.

According to an example, the model is a state-space model based on energy and mass balance principles. In a non-limiting example, the model is a physics based state-space model. An example of the physics based state-space model is described by the following equation:

$$T(k+1) = T(k) + \left\{ \sum_{i=1}^{N_{CRAC}} g_i \cdot [SAT_i(k) - T(k)] \cdot VFD_i(k) \right\} \cdot \left\{ \sum_{j=1}^{N_{tile}} b_j \cdot U_j(k) \right\} + C, \quad \text{Eqn (1)}$$

in which T represents a rack inlet temperature (location in the area), k and k+1 represent discrete time steps, $SAT_i$ and $VFD_i$ are a supply air temperature and a blower speed of the ith FMD 114a-114l, $U_j$ is the opening of the jth vent tile 118a-118m, $N_{CRAC}$ and $N_{tile}$ are the number of FMDs 114a-114l and vent tiles 118a-118m, respectively, and wherein $g_i$ and $b_j$ are parameters that capture influences of each FMD i and vent tile j, respectively, and C denotes a temperature change due to additional factors, such as recirculation and reversed flow. In instances in which the vent tiles 118a-118m are not adjustable or if the effects of the vent tiles 118a-118m on the airflow distribution are not to be factored, the term $$\left\{ \sum_{j=1}^{N_{tile}} b_j \cdot U_j(k) \right\}$$

in Eqn (1) may be set to 1 or otherwise removed from the equation.

At block 504, values for the parameters in the model are determined, for instance, by the parameter determining module 318. Generally speaking, the parameter determining, module 318 determines the values for the parameters through an analysis of detected condition data received from the sensors 120a-120n. More particularly, the parameter determining module 318 determines values for the parameters $g_i$, $b_j$ and C in Eqn (1) through an optimization process, in which the parameter values that minimize the difference between the thermal status (rack inlet temperatures) predicted by the model using the parameters ($g_i$, $b_1$, and C) being evaluated and the detected conditions. The parameters ($g_i$, $b_j$, and C) that result in the least amount of difference between the thermal status (rack inlet temperatures) predicted by the model are selected as the values for the parameters ($g_i$, $b_j$, and C). This optimization process is repeated for each rack inlet temperature since each rack inlet temperature is characterized by a different set of parameters. Alternatively, the parameter determining module 318 may implement the parameter optimization process for a plurality of different rack inlet temperatures in parallel.

The parameter ($g_i$) denotes the influence level of a particular FMD (i) 114a-114l on a particular location (7), such as on the temperature at an inlet of a particular rack. By way of example, in a data center 100 having 8 FMDs 114a-114l, each detected rack inlet temperature will have 8 influence levels ($g_i$), each representing the influence level of one FMD 114a-114l.

Turning now to FIG. 6, there is shown a flow diagram of a method 600 for managing airflow provisioning, and more particularly, for controlling, by a controller 310 of an FMD 114a, the FMD 114a to regulate the conditions at a plurality of locations that are assigned to the controller 310, according to an example. The method 600 may be implemented by each of the controllers 310 of the remaining FMDs 114b-114l in the data center 100.

In implementing the method 600, the controller 310 may have access to information to an associated FMD 114a, such as the supply air temperature and the blower speed of the FMD 114a. The controller 310 may also have access to the sensors 120a-120n located in the zone of influence of the FMD 114a.

At block 602, a cost function is accessed, for instance, by the managing module 320 from the data store 304. According to an example, the cost function comprises the total airflow provisioning power consumption and is defined with respect to the airflow provisioning actuations available on the FMD 114a. The available airflow provisioning actuations in the FMD 114a comprise temperature and volume flow rate of airflow supplied by the FMD 114a.

Figure 7:
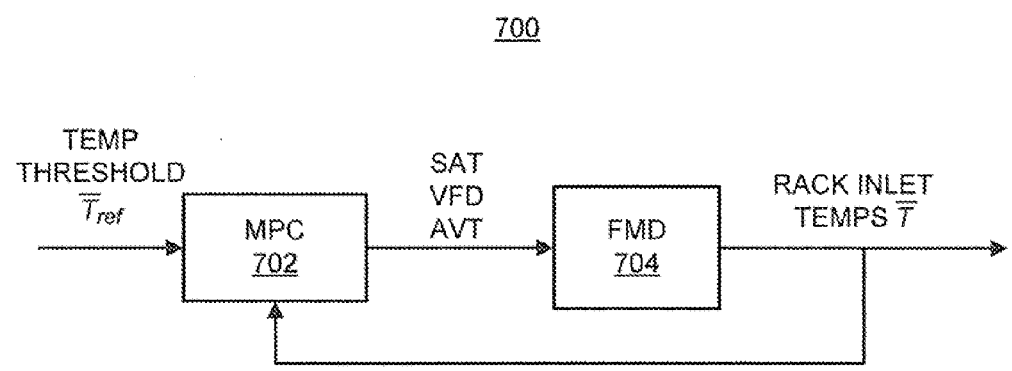
FIG. 7 depicts a control diagram that includes a model predictive controller that implements the model disclosed herein, according to an example of the present disclosure.

At block 604, airflow provisioning actuation of the FMD 114a is determined through use of a model to minimize the cost function, for instance, by the managing module 320. According to an example, and assuming that the jth zone is assigned to FMD 114a and that the vent tiles 118a-118m are not adaptive vent tiles and/or that the vent tiles 118a-118m are not considered, the model for a rack inlet temperature (7) in the jth zone may be defined as:

$$T(k+1)=T(k)+g_j \cdot [SAT_j(k)-T(k)] \cdot VFD_j(k)+C(k), \quad \text{Eqn (2)}$$

in which the influence of recirculation and FMDs 114b-114l outside the jth zone is included in the value C(k). Using this model, a model predictive controller (MPG) may be designed for each thermal zone to minimize the cooling cost incurred by each of the FMDs 114a-114l. An example of the MPG is shown in FIG. 7, which the controller 310 of the FMD 114a may use to minimize the cost function.

According to an example, given the current thermal status (rack inlet temperatures) as detected by the sensors 120a-120n to which the controller 310 of the FMD 114a is assigned, the MPG may implement the model to predict future rack inlet temperature trajectories when the trajectories of the airflow actuations (VFD and SAT of the fluid moving devices 114a-114l) are given. The prediction of the future rack inlet temperature trajectories may be used to evaluate all of the possible actuations implemented at discrete time steps with the updated current thermal status, and thus, thermal anomalies may be handled, and operating cost may constantly be minimized in response to varying conditions within the data center 100.

Additionally at block 604, the model is implemented to minimize the cost function while substantially maintaining temperature levels at the rack inlets within predetermined ranges. The following equation describes an example in which the cost function represents the total cooling power:

$$VFD_i^3(k)_{R_{VFD}}+(-SAT_i(k))_{R_{SAT}}, \quad \text{Eqn (3)}$$

in which the $R_{VFD}$ and $R_{SAT}$ are appropriate positive weights on the blower power of the FMD 114a and the thermodynamic work of the chiller plant.

At block 606, the supply air temperature and/or the volume flow rate of airflow supplied by the FMD 114*a* are actuated, for instance, through output of instruction signals by the controller 310 to the actuators of the FMD 114*a* through the input/output module 312, by the actuation module 322.

An example of a control diagram 700 that includes the MPC 702 that implements the model disclosed herein is depicted in FIG. 7. As shown therein, the MPC 702, which comprises the model and an optimization module (not shown), receives as inputs, a cost function that the optimization module runs to minimize by selecting the most appropriate airflow actuations, a threshold temperature ($\overline{T_{ref}}$) as the constraint of the optimization that future rack inlet temperatures must stay below, and rack inlet temperatures ($\overline{T}$), for future rack inlet temperature prediction using the model. In other words, the MPC 702 seeks to determine the optimal settings of the FMD 704, and in various instances, vent tiles 118*a*-118*m*, represented by the SAT, VFD, and AVT depicted in FIG. 7, in response to dynamic IT workload in a particular rack. The airflow resources provisioning, transport, and distribution are coordinated because they are considered simultaneously in the same framework to minimize the airflow provisioning power.

Some or all of the operations set forth in the methods 400-600 may be contained as utilities, programs, or subprograms, in any desired computer accessible medium. In addition, the methods 400-600 may be embodied by computer programs, which can exist in a variety of forms both active and inactive. For example, they may exist as software program(s) comprised of program instructions in source code, object code, executable code or other formats. Any of the above may be embodied on a computer readable storage medium.

Example computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 8:
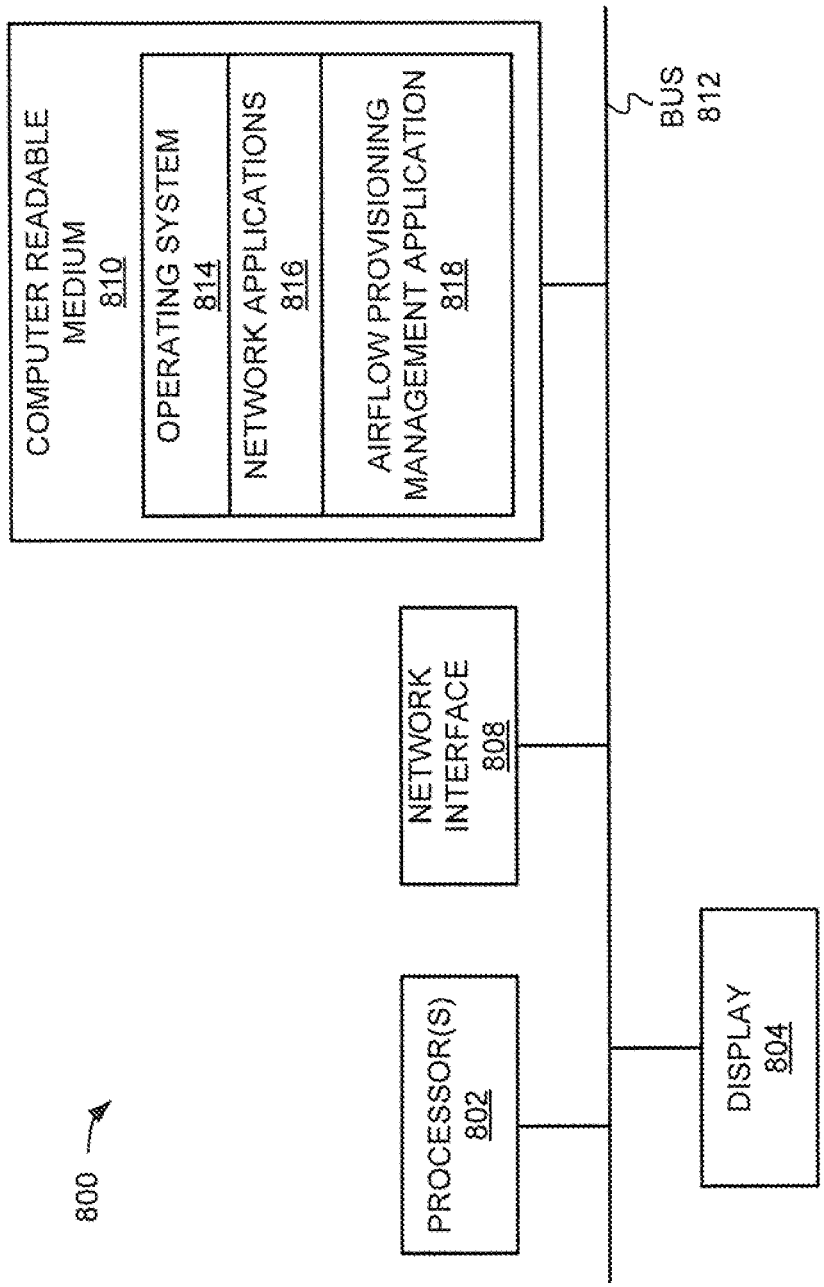
FIG. 8 illustrates a block diagram of a computing device to implement the methods depicted in FIGS. 4-6, according to an example of the present disclosure.

Turning now to FIG. 8, there is shown a block diagram of a computing device 800 to implement the methods depicted in FIGS. 4-6, in accordance with examples of the present disclosure. The device 800 includes a processor 802, such as a central processing unit; a display device 804, such as a monitor; a network interface 808, such as a Local Area Network LAN, a wireless 802.11x LAN, a 3G mobile WAN or a WiMax WAN; and a computer-readable medium 810. Each of these components is operatively coupled to a bus 812. For example, the bus 812 may be an EISA, a PCI, a USB, a FireWire, a NuBus, or a PDS.

The computer readable medium 810 may be any suitable non-transitory medium that participates in providing instructions to the processor 802 for execution. For example, the computer readable medium 810 may be non-volatile media, such as an optical or a magnetic disk; volatile media, such as memory; and transmission media, such as coaxial cables, copper wire, and fiber optics.

The computer-readable medium 810 may also store an operating system 814, such as Mac OS, MS Windows, Unix, or Linux; network applications 816; and an airflow provisioning management application 818. The network applications 816 include various components for establishing and maintaining network connections, such as machine readable instructions for implementing communication protocols including TCP/IP, HTTP, Ethernet, USB, and FireWire.

The airflow provisioning management application 818 provides various components for managing airflow provisioning in a data center 100, as described above. The management application 818 may thus comprise any of the controllers 130, 310 discussed above. In this regard, the management application 818 may include the modules 312-322, which are also discussed above. In certain examples, some or all of the processes performed by the application 818 may be integrated into the operating system 814. In certain examples, the processes may be at least partially implemented in digital electronic circuitry, or in computer hardware, machine readable instructions (including firmware and/or software), or in any combination thereof.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A method for managing airflow provisioning in an area by a plurality of fluid moving devices, said method comprising:

accessing a predefined cooling influence redundancy level for a plurality of locations in the area, wherein the cooling influence redundancy level for a particular location identifies a number of the fluid moving devices that are to monitor and regulate a condition at the particular location;

determining respective influence levels of the plurality of fluid moving devices on each of the plurality of locations;

determining, for each location of the plurality of locations, a set of fluid moving devices having the highest influence levels on the location, a number in each set equaling the predefined cooling influence redundancy level, each of the fluid moving devices having a respective controller;

assigning, by a processor, for each of the locations, controllers of the determined set of fluid moving devices having the highest influence levels on the location to monitor and regulate the condition at the location to meet the predefined cooling influence redundancy level; and wherein the processor controls the controllers of the determined set of fluid moving devices having the highest influence levels on the location.

2. The method according to claim 1, wherein accessing the predefined cooling influence redundancy level further comprises:

accessing a first predefined cooling influence redundancy level for a first location and a second predefined cooling influence redundancy level for a second location, wherein the second predefined cooling influence redundancy level differs from the first predefined cooling influence redundancy level; and wherein determining, for each of the locations, a set of fluid moving devices further comprises determining, a first set of fluid moving devices and a second set of fluid moving devices, a number of the first set equaling the first predefined cooling influence redundancy level and a number of the second set equaling the second predefined cooling influence redundancy level.

3. The method according to claim 1, wherein a plurality of sensors detect conditions at the plurality of locations and wherein the controllers are to access the detected conditions to monitor and regulate the conditions of the respective locations.

4. The method according to claim 1, wherein determining respective influence levels of the plurality of fluid moving devices on each of the plurality of locations further comprises:
accessing a model that describes airflow transport and distribution within the area, said model comprising a plurality of parameters; and
determining values for the plurality of parameters, wherein at least one of the plurality of parameters comprises the influence level of the plurality of fluid moving devices on each of the plurality of locations.

5. The method according to claim 4, wherein the model further describes effects of actuations on the plurality of fluid moving devices on the airflow transport and distribution within the area.

6. The method according to claim 4, wherein the plurality of locations in the area comprises a plurality of racks, wherein the plurality of fluid moving devices are to supply airflow to the plurality of racks through a shared plenum, and wherein the model is described by the following equation:

$$T(k+1) = T(k) + \left\{ \sum_{i=1}^{N_{CRAC}} g_i \cdot [SAT_i(k) - T(k)] \cdot VFD_i(k) \right\} \cdot \left\{ \sum_{j=1}^{N_{tile}} b_j \cdot U_j(k) \right\} + C,$$

wherein T represents a rack inlet temperature, k and k+1 represent discrete time steps, $SAT_i$ and $VFD_i$ are a supply air temperature and a blower speed of the ith fluid moving device, $U_j$ is the opening of a jth adjustable vent tile, $N_{CRAC}$ and $N_{tile}$ are the number of fluid moving devices and adjustable vent tiles, respectively, and wherein $g_i$ and $b_j$ are the parameters that capture influences of each fluid moving device i and adjustable vent tile j, respectively, and C denotes a temperature change caused by additional factors.

7. The method according to claim 4, wherein each of the plurality of fluid moving devices is managed by a respective controller, the method further comprising implementing, by each of the controllers, the model to control a respective fluid moving device to regulate the conditions at the plurality of locations.

8. The method according to claim 7, wherein implementing, by each of the controllers, the model to control the plurality of fluid moving devices further comprises:
accessing a cost function; and
determining an actuation of the respective fluid moving device through use of the model to minimize the cost function while maintaining conditions at the plurality of locations assigned to the respective controllers of the plurality of fluid moving devices within predetermined ranges.

9. An apparatus for managing airflow provisioning in an area by a plurality of fluid moving devices, said apparatus comprising:
a memory storing at least one module comprising machine readable instructions to:
access a predefined cooling influence redundancy level for a plurality of locations in the area, wherein the cooling influence redundancy level for a particular location identifies a number of the fluid moving devices that are to monitor and regulate a condition at the particular location;
determine respective influence levels of the plurality of fluid moving devices on each of the plurality of locations through use of a model that describes airflow transport and distribution within the area, each of the fluid moving devices having a respective controller;
determine, for each location of the plurality of locations, a set of fluid moving devices having the highest influence levels on the location, a number in each set equaling the predefined cooling influence redundancy level;
assign, for each of the locations, controllers of the determined set of fluid moving devices having the highest influence levels on the location to monitor and regulate the condition at the location to meet the predefined cooling influence redundancy level; and
wherein the apparatus controls the controllers of the determined set of fluid moving devices having the highest influence levels on the location.

10. The apparatus according to claim 9, wherein the model comprises a plurality of parameters, and wherein the at least one module further comprises machine readable instructions to determine values for the plurality of parameters, wherein at least one of the plurality of parameters comprises the influence level of the plurality of fluid moving devices on each of the plurality of locations.

11. The apparatus according to claim 9, wherein the at least one module further comprises machine readable instructions to:
access a cost function; and
determine an actuation of a respective fluid moving device through use of the model to minimize the cost function while maintaining conditions at the plurality of locations assigned to the respective controllers of the plurality of fluid moving devices within predetermined ranges.

12. A non-transitory computer readable storage medium on which is embedded at least one computer program that when executed by a processor, implements a method for managing airflow provisioning in a data center by a plurality of fluid moving devices, said at least one computer program comprising computer readable code to:
access a predefined cooling influence redundancy level for a plurality of rack inlets of interest in the data center, wherein the cooling influence redundancy level for a particular rack inlet identifies a number of the fluid moving devices that are to monitor and regulate a condition at the particular rack inlet;
determine respective influence levels of the plurality of fluid moving devices on each of the rack inlets of interest in the data center, each of the fluid moving devices having a respective controller;
determine, for each location of the plurality of locations, a set of fluid moving devices having the highest influence levels on the location, a number in each set equaling the predefined cooling influence redundancy level;

assign, for each of the locations, controllers of the determined set of fluid moving devices having the highest influence levels on the location to monitor and regulate the conditions of respective subsets of the plurality of rack inlets of interest to meet the predefined cooling influence redundancy level; and wherein the processor controls the controllers of the determined set of fluid moving devices having the highest influence levels on the location.

13. The non-transitory computer readable storage medium according to claim 12, said at least one computer program further comprising computer readable code to:

access a cost function; and determine an actuation of a respective fluid moving device through use of the model to minimize the cost function while maintaining conditions at the plurality of locations assigned to the respective controllers of the plurality of fluid moving devices within predetermined ranges.

* * * * *